US006573200B2

(12) United States Patent
Pakerisamy et al.

(10) Patent No.: US 6,573,200 B2
(45) Date of Patent: Jun. 3, 2003

(54) AUTOMATIC PRINTING OF CAUTION LABELS FOR MOISTURE-SENSITIVE DEVICES

(75) Inventors: Saragarvani Pakerisamy, San Jose, CA (US); Kesmond Kwek, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 151 days.

(21) Appl. No.: 09/761,180

(22) Filed: Jan. 18, 2001

(65) Prior Publication Data

US 2002/0092270 A1 Jul. 18, 2002

(51) Int. Cl.[7] ............................................ H01L 21/00

(52) U.S. Cl. ...................... 438/800; 206/725; 206/726; 235/385; 340/602

(58) Field of Search ......................... 438/800; 206/714, 206/725, 726; 235/385; 340/602

(56) References Cited

U.S. PATENT DOCUMENTS 4,971,196 A * 11/1990 Kitamura et al. ........... 206/204
5,875,897 A * 3/1999 Duncan et al. ............. 206/714
6,474,476 B1 * 11/2002 Anderson et al. ........... 206/725
2001/0032800 A1 * 10/2001 Numazaki et al. .......... 206/725
2002/0185409 A1 * 12/2002 Morrow ...................... 206/725

FOREIGN PATENT DOCUMENTS

EP 0675458 A 10/1995

* cited by examiner

*Primary Examiner*—John F. Niebling
*Assistant Examiner*—Jennifer M. Kennedy

(57) ABSTRACT

A novel system is provided for automatically generating caution labels for moisture-sensitive semiconductor devices packed in drypack bags. The system has a scanner that scans a lot number or an ID mark representing ID information of a moisture-sensitive device sealed in a drypack bag, and a computing device with a look-up table containing moisture-sensitivity levels assigned to the moisture-sensitive devices. In response to an ID signal produced by the scanner, the computing device searches the look-up table for a moisture-sensitivity level assigned to the packed moisture-sensitive device. The determined moisture-sensitivity level is supplied by the computing device to a label-formatting device for generating a caution label indicating the moisture-sensitivity level. The label-formatting device controls a printer for printing the generated caution label.

4 Claims, 2 Drawing Sheets

10

AUTOMATIC PRINTING OF CAUTION LABELS FOR MOISTURE-SENSITIVE DEVICES

FIELD OF THE INVENTION

The present invention relates to integrated circuit packaging technology, and more specifically, to marking moisture-sensitive devices with labels relevant to dry pack processes.

BACKGROUND ART

Due to absorbed moisture, semiconductor devices such as solid state Surface Mount Devices (SMD) could be damaged during solder reflow. The vapor pressure of moisture inside a plastic package of a semiconductor device increases rapidly when the package is exposed to the high temperature of solder reflow. Under certain conditions, this pressure can cause internal delamination of the plastic from the die and/or leadframe, internal cracks that do not extend to the outside of the package, bond damage, wire necking, bond lifting, die lifting, thin film cracking, or cratering beneath the bond. In the most severe case, the stress can result in external package cracks. This is commonly referred to as the "popcorn" phenomenon because the internal stress causes the package to buldge and then crack with an audible "pop".

SMDs are more susceptible to this problem then through-hole parts because they are exposed to higher temperatures during reflow soldering. For through-hole devices, the soldering operation occur under the board that shilds the device from the hot solder.

Further, the risk of moisture-induced damage is higher when plastic encapsulation materials are used because plastic is naturally permeable to moisture. The moisture in the package will increase to reach the Relative Humidity (RH) of the surrounding environment.

Controlling the moisture level in the package body is therefore crytical to reducing the risk of moisture-induced damage. To avoid the moisture absorbtion, moisture-sensitive devices are packed in a drypack that consists of desiccant material and a Humidity Indicator Card (HIC) sealed together with the devices inside a moisture barrier bag (MBB). The desiccant material is an absorbent material such as a silica gel used to maintain a low relative humidity in the MBB. The HIC is a card on which a moisture chemical is printed such that it will change color from blue to pink when the preset relative humidity is exceeded.

The IPC/JEDEC J-STD-033 Standard developed by an Institute for Interconnecting and Packaging Electronic Circuits (IPC) and Joint Electronic Device Engineering Council (JEDEC) contains requirements for handling, packing, shipping and use of moisture-sensitive surface mount devices. In particular, this standard requires that a MBB used to pack moisture-sensitive devices should be labeled with a moisture-sensitive caution label. Examples of the moisture-sensitive caution labels are shown in FIG. 1.

The caution label affixed to the outside surface of the MBB varies to reflect the specific product in the bag. The label identifies the contents of the bag and includes the date the bag was sealed, the dry pack expiration date, as well as product handling guidelines.

Also, the caution label contains a moisture-sensitivity (MS) level defined by the IPC/JEDEC J-STD-020A Standard. Moisture-sensitivity levels indicate a time limit for storing a moisture-sensitive device after opening the MBB and prior to mounting the device onto a circuit board, and temperature and humidity to be maintained in storage. The out-of-bag time limit varies depending on the moisture-sensitivity of the product. If the out-of-bag time from initial exposure to board mounting is exceeded, the product should be baked at a prescribed temperature for a prescribed time period.

The IPC/JEDEC J-STD-020A Standard defines six different moisture-sensitivity levels, referred to as level 1 through level 6. Each higher level denotes a higher level of sensitivity. In particular, level 1 corresponds to unlimited exposure time at a temperature not higher than 30° C. and relative humidity not higher than 85%. Levels 2, 2a, 3, 4, 5, and 5a require exposure time to be not more than one year, 4 weeks, 168 hours, 72 hours, 48 hours, and 24 hours, respectively. Level 6 is product specific. It directs to follow specific instructions on dry pack label. Levels 2 to 6 prescribe out-of-bag storage at a temperature not higher than 30° C. and relative humidity not higher than 60%.

Products are tested to determine their moisture-sensitivity level. Product that fails the level 1 test requirements is then tested at a higher level until it passes. Specific environment stress steps subject the product to conditions designated to simulate the environment of an end-use application. Subsequent electrical testing and inspection steps determine if the device was damaged during the environment stress steps.

Once it is determined that product is moisture sensitive (i.e. it fails the level 1 test), the product is packed in a drypack, and is subject to the dry pack handling procedure prescribed by the IPC/JEDEC J-STD-033 Standard. In particular, a pre-printed caution label is affixed to the outside surface of the drypack to identify the moisture-sensitivity level of the product.

However, labeling of the drypack products is performed manually. As a result, a wrong label can be attached to a drypack. This can cause moisture-induced failure of the device due to incorrect out-of-bag exposure time.

Accordingly, it would be desirable to provide an automatic system for printing correct level caution labels for drypack products, in order to prevent errors during labeling process.

SUMMARY OF THE INVENTION

The present invention offers a novel system for automatically generating caution labels for moisture-sensitive semiconductor devices packed in drypack bags. The system comprises a scanner that scans an ID mark representing ID information of a moisture-sensitive device sealed in a drypack bag, and a computing device with a look-up table containing moisture-sensitivity levels assigned to the moisture-sensitive devices. In response to an ID signal produced by the scanner, the computing device searches the look-up table for a moisture-sensitivity level assigned to the packed moisture-sensitive device. The determined moisture-sensitivity level is supplied by the computing device to a label-formatting device for generating a caution label indicating the moisture-sensitivity level. The label-formatting device may control a printer for printing the generated caution label.

In a prefered embodiment of the invention, the moisture-sensitivity levels comply with the IPC/JEDEC J-STD-020A Standard. The look-up table may further comprise information on type of the devices, and lead counts of the devices.

In accordance with a method of the present invention, caution labels are printed automatically when an operator performs labeling of a drypack bag containg a moisture-sensitive device. An ID mark representing ID information of the package sealed in the drypack bag is scanned to produce an ID signal representing the package. Based on the ID signal, a pre-set look-up table is searched for a moisture-sensitivity level assigned to the package. A caution label is automatically generated based on the moisture-sensitivity level found in the look-up table.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

As discussed above, integrated circuit packages are tested to determine their moisture-sensitivity level. The package that fails the level 1 test requirements is then tested at a higher level until it passes. As a result, a particular moisture-sensitivity level is established for each moisture-sensitive device.

The IPC/JEDEC J-STD-033 Standard developed by an Institute for Interconnecting and Packaging Electronic Circuits (IPC) and Joint Electronic Device Engineering Council (JEDEC) contains requirements for handling, packing, shipping and use of moisture-sensitive surface mount devices. In particular, this standard defines a drypack process for packing moisture-sensitive devices.

The first step in the drypack process is to remove any moisture buildup in the package by baking the finished product for 4.5 to 15.5 hours, depending on the package type, at 125° C. Within 24 to 50 hours after baking, depending on package type, the product is sealed in a drypack bag (i.e. moisture barrier bag) under a partial vacuum.

In accordance with the IPC/JEDEC J-STD-033 Standard, a caution label should be attached on the outside surface of each drypack bag. The caution label should contain the moisture-sensitivity level established for a particular IC package sealed in the drypack bag.

Conventionally, caution labels with different moisture-sensitivity levels are pre-printed. An operator manually selects the label appropriate for a particular drypack bag based on a specification, and attaches the label to the bag. However, this manual labeling procedure is prone to errors, because the operator can attach a wrong caution label to a given drypack bag. A wrong caution label can cause the customer to store the moisture-sensitive device removed from the bag for a time period exceeding the out-of-bag exposure time defined by the moisture-sensitivity level of that device. As a result, the device can be damaged during solder reflow.

Figure 1:
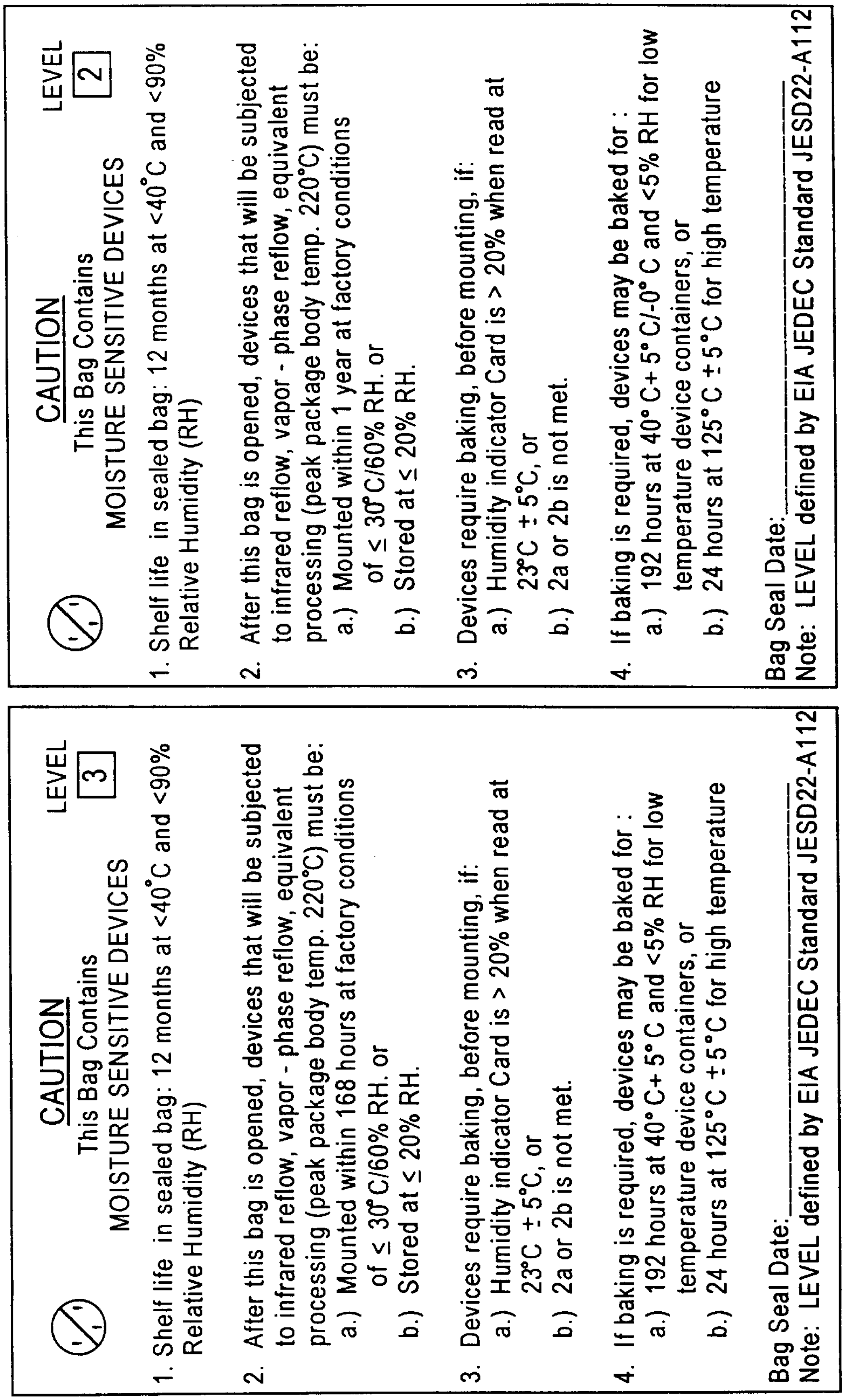
FIG. 1 illustrates caution labels defined in the IPC/JEDEC J-STD-033 Standard.
Figure 2:
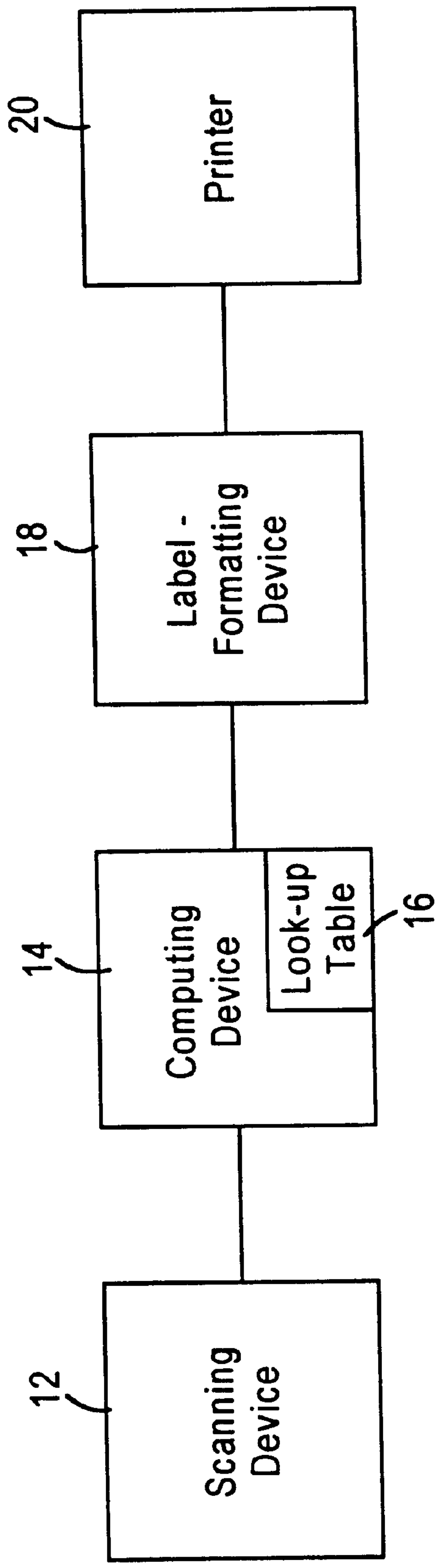
FIG. 2 is a block-diagram of a system for automatically printing caution labels in accordance with the present invention.

To prevent drypack labeling errors, the present invention offers a system for automatically printing caution labels during drypack process. As shown in FIG. 2, the system 10 for automatically printing caution labels comprises a scanning device 12, a computing device 14 having a look-up table 16, a label formatting device 18, and a printer 20.

The look-up table 16 may contain such device information as a package type, a lead count, a device idenification number, and a moisture-sensitivity level assigned to that device. For example, the look-up table may be provided in a computer system that handles drypacking process.

Each drypack bag contains an identification label that identifies the contents of the bag. For example, the contents of the drypack bag may be identified by manufacturing lot number. The scanning device 12 connected to the computing device 14 is used by an operator to scan the lot number on the processing sheet.

The lot number of the drypack bag scanned by the scanning device 12 serves as an index for searching the look-up table 16. Using this identification information, the computing device 14 searches the look-up table 16 for data associated with the identification information of the drypack bag. In particular, the computing device 14 determines the moisture-sensitivity level assigned to the device packed in the drypack bag.

The computing device 14 produces a signal representing the moisture-sensitivity level and other relevant information, and transfers this signal to the label formatting device 18 that contains information required to generate the caution label. For example, a VAX workstation manufactured by Digital Equipment Corporation may be used for performing label formatting functions, and generating caution labels. The printer 20 connected to the label formatting device 18 prints the caution label having the moisture-sensitivity level assigned to the device sealed in the drypack bag.

Thus, in accordance with the present invention, caution labels are printed automatically when an operator performs labeling of a drypack bag containing a moisture-sensitive IC package. A lot number or an ID mark representing ID information of the package sealed in the drypack bag is scanned to produce an ID signal representing the package. Based on the ID signal, a pre-set look-up table is searched for a moisture-sensitivity level assigned to the package. A caution label is automatically generated based on the moisture-sensitivity level found in the look-up table.

In this disclosure, there are shown and described only the preferred embodiment of the invention, but it is to be understood that the invention is capable of changes and modifications within the scope of the inventive concept as expressed herein. For example, the scanning device, computing device and label-formatting device may be incorporated into a single workstation responsible for handling drypacking process.

What is claimed is:

1. System for automatically generating caution labels for moisture-sensitive semiconductor devices packed in drypack bags, the system comprising:

a scanner for scanning an ID mark representing ID information of a moisture-sensitive device sealed in a drypack bag to produce an ID signal, a computing device having a look-up table containing moisture-sensitivity levels assigned to the moisture-sensitive devices, the computing device being responsive to the ID signal produced by the scanner for searching the look-up table for a moisture-sensitivity level assigned to the moisture-sensitive device, and a label-formatting device responsive to the moisture-sensitivity level supplied by the computing device for generating a caution label indicating the moisture-sensitivity level.

2. The system of claim 1, wherein the moisture-sensitivity levels comply with the IPC/JEDEC J-STD-020A Standard.

3. The system of claim 1 further comprising a printer responsive to the label-formatting device for printing the caution label.

4. The system of claim 1, wherein the look-up table further comprises information on type of the devices, and lead counts of the devices.

* * * * *